(12) United States Patent
Melvin, III et al.

(10) Patent No.: US 11,187,973 B2
(45) Date of Patent: Nov. 30, 2021

(54) REFLECTIVE EUV MASK ABSORBER MANIPULATION TO IMPROVE WAFER CONTRAST

(71) Applicant: Synopsys, Inc., Mountain View, CA (US)

(72) Inventors: Lawrence S. Melvin, III, Hillsboro, OR (US); Yudhishthir P. Kandel, Durham, NC (US)

(73) Assignee: Synopsys, Inc., Mountain View, CA (US)

( * ) Notice: Subject to any disclaimer, the term of this patent is extended or adjusted under 35 U.S.C. 154(b) by 85 days.

(21) Appl. No.: 16/570,469

(22) Filed: Sep. 13, 2019

(65) Prior Publication Data

US 2020/0089101 A1   Mar. 19, 2020

Related U.S. Application Data

(60) Provisional application No. 62/731,433, filed on Sep. 14, 2018.

(51) Int. Cl.
| | | |
|---|---|---|
| *G03F 1/24* | (2012.01) | |
| *G03F 1/22* | (2012.01) | |
| *G03F 1/36* | (2012.01) | |
| *G03F 1/70* | (2012.01) | |

(52) U.S. Cl.
CPC ............... *G03F 1/24* (2013.01); *G03F 1/22* (2013.01); *G03F 1/36* (2013.01); *G03F 1/70* (2013.01)

(58) Field of Classification Search
CPC ..... G03F 1/22; G03F 1/24; G03F 1/36; G03F 1/70

USPC .............................................................. 430/5
See application file for complete search history.

(56) References Cited

U.S. PATENT DOCUMENTS

| | | | |
|---|---|---|---|
| 2006/0188673 A1 | 8/2006 | Melvin, III | |
| 2016/0011501 A1 | 1/2016 | Huang et al. | |
| 2020/0041891 A1* | 2/2020 | Hsu | .......................... G03F 1/24 |

FOREIGN PATENT DOCUMENTS

JP    2008116862 A    5/2008

OTHER PUBLICATIONS

International Search Report and Written Opinion from the Japan Patent Office for PCT Patent Application No. PCT/US2019/051083 dated Nov. 26, 2019.

* cited by examiner

*Primary Examiner* — Christopher G Young
(74) *Attorney, Agent, or Firm* — Park, Vaughan, Fleming & Dowler LLP; Laxman Sahasrabuddhe

(57) ABSTRACT

Techniques and systems for improving wafer contrast by manipulating reflective extreme ultraviolet (EUV) mask absorber are described. Some embodiment disclosed herein provide for EUV absorber material, which transmits some EUV illumination, to suppress the printing of sub-resolution assist features (SRAFs) while making the SRAFs closer in size to the printed feature by thinning the SRAF absorber thickness from the nominal mask absorber thickness in the bright-field mask case. In the dark-field mask case, a layer of absorber material is left in the SRAF trenches to prevent SRAF printing.

15 Claims, 7 Drawing Sheets

REFLECTIVE EUV MASK ABSORBER MANIPULATION TO IMPROVE WAFER CONTRAST

RELATED APPLICATION

This application claims benefit of U.S. Provisional Application Ser. No. 62/731,433, filed on 14 Sep. 2018, the contents of which are herein incorporated by reference in their entirety for all purposes.

COPYRIGHT NOTICE

The assignee of this patent document does not object to the facsimile reproduction of the patent document as it appears in the files of the United States Patent and Trademark Office, but otherwise reserves all rights whatsoever in any included works of authorship protected by copyright.

BACKGROUND

Technical Field

This disclosure relates to a resolution enhancement technique (RET). More specifically, this disclosure relates to reflective extreme ultraviolet (EUV) mask absorber manipulation to improve wafer contrast.

Related Art

Rapid advances in computing technology have made it possible to perform trillions of computational operations each second on data sets that are sometimes as large as trillions of bytes. These advances can largely be attributed to the dramatic improvements in semiconductor manufacturing technologies which have made it possible to integrate tens of millions of devices onto a single chip.

In its continued push toward miniaturization, the semiconductor manufacturing industry needs techniques and systems for reliably printing ever smaller features using EUV lithography.

SUMMARY

This section is not intended to limit the scope of the disclosed subject matter. The disclosed subject matter is to be accorded the widest scope consistent with the principles and features disclosed in the entire disclosure. Some embodiments described herein provide systems and techniques for reflective EUV mask absorber manipulation to improve wafer contrast.

Some embodiments receive a bright-field mask layout comprising a set of main feature shapes, each main feature shape representing a mask feature made of absorber material having a first thickness. Next, the embodiments add at least one sub-resolution assist feature (SRAF) shape to the bright-field mask layout, the SRAF shape representing a mask feature made of absorber material having a second thickness that is less than the first thickness. In some embodiments, the bright-field mask layout is used to create a bright-field mask for use in EUV lithography. In some embodiments, the bright-field mask prints the set of main feature shapes, but not the SRAF shape, on a wafer during EUV lithography. Some embodiments add at least two SRAF shapes to the bright-field mask layout, the two SRAF shapes representing mask features made of absorber material having different thicknesses that are less than the first thickness. Some embodiments store the bright-field mask layout in a data format that allows a distinct absorber material thickness to be specified for each shape in the bright-field mask layout.

Some embodiments receive the dark-field mask layout comprising a set of main feature shapes, each main feature shape representing a main feature trench in an absorber material layer, wherein the main feature trench does not include any absorber material. Next, the embodiments add at least one SRAF shape to the dark-field mask layout, the SRAF shape representing an SRAF trench in the absorber material layer, wherein the SRAF trench includes at least some absorber material. In some embodiments, the dark-field mask layout is used to create a dark-field mask for use in EUV lithography. In some embodiments, the dark-field mask prints the set of main feature shapes, but not the at least one SRAF shape, on a wafer during EUV lithography. Some embodiments add at least two SRAF shapes to the dark-field mask layout, the two SRAF shapes representing SRAF trenches in the absorber material layer having different amounts of absorber material. Some embodiments store the dark-field mask layout in a data format that allows a distinct amount of absorber material to be specified for each SRAF shape in the dark-field mask layout.

Some embodiments provide a bright-field EUV mask, comprising: a multilayer reflector; a set of main features disposed on the multilayer reflector, each main feature made of absorber material having a main feature thickness; and a first SRAF disposed on the multilayer reflector, the first SRAF made of absorber material having a first SRAF thickness that is less than the main feature thickness. In some embodiments, the bright-field EUV mask comprises a second SRAF disposed on the multilayer reflector, the second SRAF made of absorber material having a second SRAF thickness that is less than the main feature thickness, but that is different from the first SRAF thickness. In some embodiments, the width of the first SRAF can be different from the width of the second SRAF. In some embodiments, the bright-field EUV mask prints the set of main features, but not the SRAFs, on a wafer during EUV lithography.

Some embodiments provide a dark-field EUV mask, comprising: a multilayer reflector; an absorber material layer disposed on the multilayer reflector; a set of main feature trenches in the absorber material layer, each main feature trench not having any absorber material; and a first SRAF trench in the absorber material layer, wherein the SRAF trench includes a first amount of absorber material. In some embodiments, the dark-field EUV mask comprises a second SRAF trench in the absorber material layer, wherein the second SRAF trench includes a second amount of absorber material, the second amount being different from the first amount. In some embodiments, the width of the first SRAF trench can be different from the width of the second SRAF trench. In some embodiments, the dark-field EUV mask prints the set of main feature trenches, but not the SRAF trenches, on a wafer during EUV lithography.

DETAILED DESCRIPTION

Figure 1:
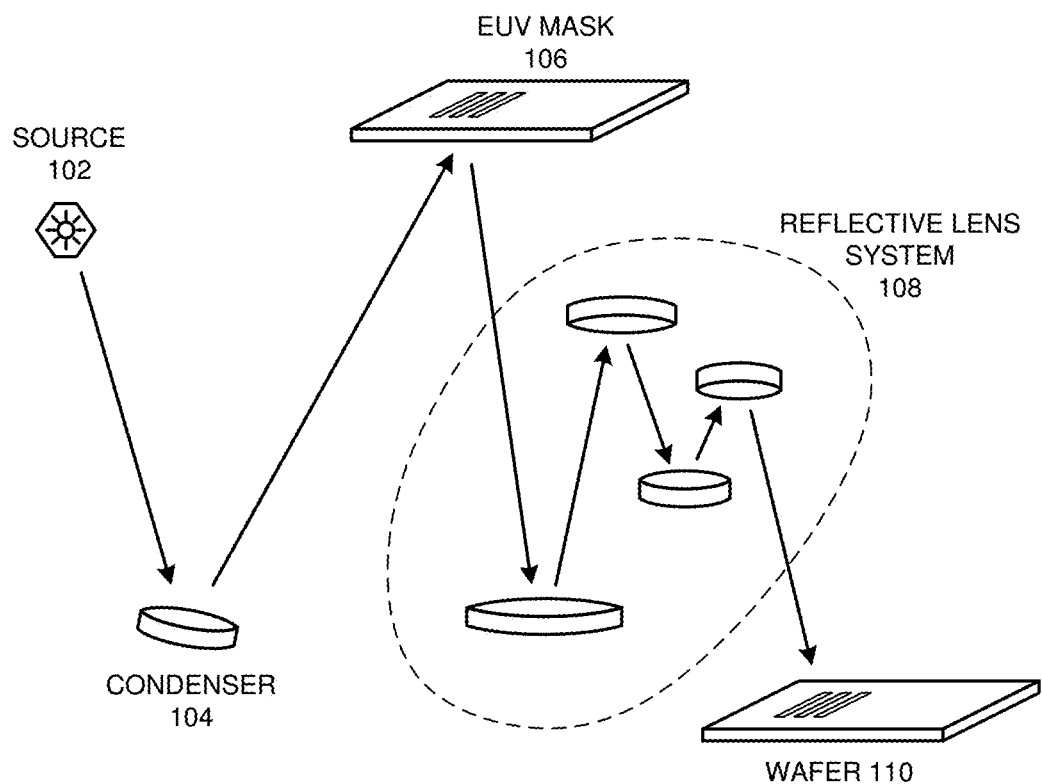
FIG. 1 illustrates an EUV lithography system in accordance with some embodiments described herein.

The following description is presented to enable any person skilled in the art to make and use the claimed invention(s), and is provided in the context of particular application(s) and/or environment(s). Various modifications to the disclosed embodiments will be readily apparent to those skilled in the art, and the general principles defined herein may be applied to other embodiments and applications without departing from the spirit and scope of the disclosure. Thus, the disclosed subject matter is not limited to the embodiments shown, but is to be accorded the widest scope consistent with the principles and features disclosed herein.

In this disclosure, numerous specific details may be described to enable one or more of the embodiments. In the interest of not obscuring the presentation of the embodiments, some features that are known in the art may be combined together, may be described in less detail, or may be implied (i.e., some well-known features may not be explicitly described). Furthermore, while this description may refer to some features in the singular tense, more than one instance of the feature may be illustrated in the figures, and like components are labeled with like numerals.

An integrated circuit (IC) design and manufacturing process produces IC chips. IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results.

As an IC design progresses through an IC design flow, the IC design can be represented at different levels of abstraction by using different data formats or languages. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (i.e., the description of the IC design becomes more specific as the IC design progresses through the IC design flow).

For example, toward the beginning of the IC design flow, an IC design can be described at a high level of abstraction by using a hardware description language (HDL) which describes the functionality of the IC design but does not include information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between these two ends of the IC design flow, the IC design may be represented in numerous data formats or languages that describe the same IC design at different levels of abstraction.

Some examples of IC design steps and the associated software tools are described below. These examples are for illustrative purposes only and are not intended to limit the embodiments to the forms disclosed. This disclosure describes techniques and systems that can be used in one or more IC design steps.

IC design software tools enable IC designers to describe the functionality that the IC designers want to implement. These tools also enable IC designers to perform what-if planning to refine functionality, check costs, etc. During logic design and functional verification, the HDL, e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence (i.e., equivalence checking) with the RTL design and/or HDL code.

During design planning, an overall floorplan for the chip can be constructed and analyzed for timing and top-level routing. During physical implementation, circuit elements can be positioned in the layout and can be electrically connected.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

FIG. 1 illustrates an EUV lithography system in accordance with some embodiments described herein. During photolithography, a pattern on EUV mask 106 is printed on wafer 110. Specifically, EUV light from source 102 can be focused and reflected by condenser 104. The EUV light can then be reflected by EUV mask 106, and by reflective lens system 108, before imaging on wafer 110. After the wafer is exposed, the patterns can be developed by subjecting the wafer to various chemical and physical processes.

EUV mask 106 can be of two types—bright-field and dark-field. In a bright-field mask, the pattern on the resist layer on the wafer's surface is formed by blocking EUV light at the EUV mask (i.e., by not reflecting the EUV light at the EUV mask). On the other hand, in a dark-field mask, the pattern on the resist layer on the wafer's surface is formed by passing EUV light at the mask (i.e., by reflecting the EUV light at the EUV mask).

SRAFs (Sub Resolution Assist Features) are placed on lithography masks to enhance the printed image on the wafer without the SRAFs themselves printing on the wafer (that's why they are called "sub-resolution"). In conventional approaches, SRAFs are between half and three quarters the size of the printed feature so they do not print. Embodiment disclosed herein provide for EUV absorber material, which transmits some EUV illumination, to suppress the printing of SRAFs while making the SRAFs closer in size to the printed feature by thinning the SRAF absorber thickness from the nominal mask absorber thickness in the bright-field mask case. In the dark-field mask case, a thin layer of absorber material is left in the SRAF trenches to prevent SRAF printing. This results in improved quality wafer imaging from the larger SRAF without the SRAF leaving an image in the photoresist.

Specifically, SRAFs improves the image quality by creating or enhancing a diffraction pattern in the aerial image. The enhanced aerial image has greater contrast which reduces susceptibility to defocus and other phase effects as well as line-edge roughness, resulting in more robust (thus cheaper) manufacturing. The closer the SRAF is to the feature size, the better the SRAF improves the diffraction pattern, but the more likely the SRAF is to print. For this reason, in conventional approaches, SRAFs are between half and three quarters the size of the printed feature so they do not print. However, limiting the width of SRAFs also limits amount of contrast improvement that SRAFs can achieve.

Embodiments described herein use the fact that EUV absorber material transmits some EUV illumination to suppress the printing of SRAFs while making them closer in size to the printed feature. Embodiments described in this disclosure specifically thin the SRAF absorber thickness from the nominal mask absorber thickness in the bright-field mask case. In the dark-field mask case, the embodiments leave a thin layer of absorber material in the SRAF trenches to prevent SRAF printing. This results in improved quality wafer imaging from the larger SRAF (i.e., SRAFs with a larger width) without the SRAF leaving an image in the photoresist. Also, it allows the SRAF width to be optimized into regions that are in danger of printing.

The EUV mask absorber is a material whose intended function is to absorb EUV radiation in areas where light is not supposed to be reflected by the mask. However, the EUV absorber is not perfect, and it leaks light as seen in the equation below:

$$\% \ IntensityAbsorbed = (e^{-\frac{Mag*4\pi k*Pathlength}{\lambda}})*100$$

In the above equation, "Mag" is the mask magnification (e.g., "4×"), "k" is the coefficient of extinction, "Pathlength" is the distance that the light travels through the mask absorber, and $\lambda$ is the wavelength (e.g., 13.5 nm).

Figure 2:
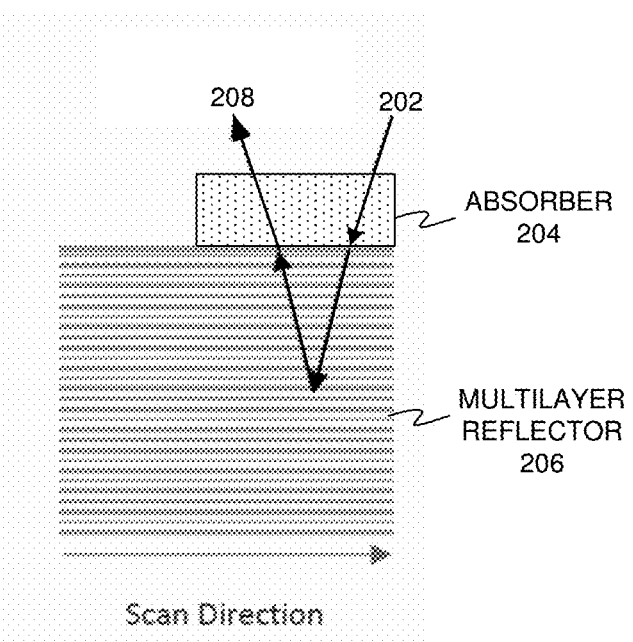
FIG. 2 illustrates a cross-section of an EUV mask in accordance with some embodiments described herein.

FIG. 2 illustrates a cross-section of an EUV mask in accordance with some embodiments described herein. EUV light ray 102 passes through absorber 104, and is reflected by the multilayer stack 106. After being reflected by multilayer stack 106, the EUV light ray passes through absorber 104 again and exits as EUV light ray 108. EUV light ray 108 then travels to the wafer, where it forms an image by combining with other light rays. SRAFs are used to increase the strength of the diffraction pattern around desired features. This can be thought of as the summation of a series of "sinc" functions that are offset from each other. When using an SRAF, the SRAFs will be narrower so they will not print, but will still add to the final image profile. In EUV, the absorber is not a perfect absorber. For example, in the case of a 60 nm thick absorber, assuming 60% reflectivity of the multilayer stack, about 1.8% of the light that enters the absorber is reflected thorough the absorber by the multilayer and back out through the absorber.

This absorber transmission allows the embodiments described herein to increase the width of the SRAFs without having them print on the wafer. In the bright-field case (where the pattern in the resist is formed by blocking transmission) the SRAF patterns are thinned, which allows light through the SRAFs. The light allowed through the SRAFs keeps larger SRAFs from darkening sufficiently to print the SRAF.

Figure 3A:
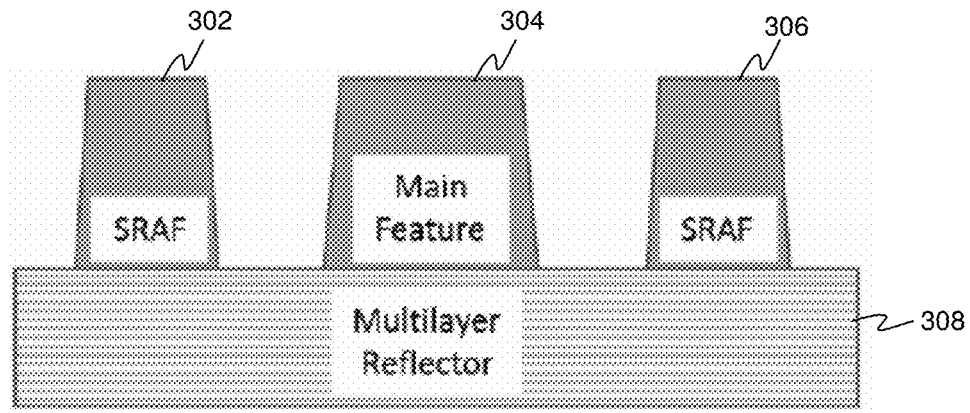
FIGS. 3A-3B illustrate a cross-section of a bright-field EUV mask in accordance with some embodiments described herein.
Figure 3B:
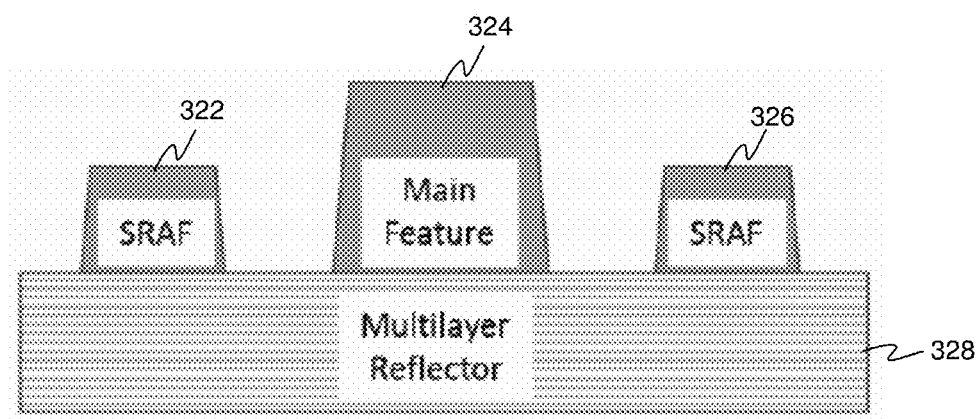

FIGS. 3A-3B illustrate a cross-section of a bright-field EUV mask in accordance with some embodiments described herein.

FIG. 3A illustrates main feature 304 and SRAFs 302 and 306 disposed over multilayer reflector 308 as in a conventional bright-field EUV mask. Note that the absorber material thickness of main feature 304 and SRAFs 302 and 306 are equal.

FIG. 3B illustrates main feature 324 and SRAFs 322 and 326 disposed over multilayer reflector 328 in a bright-field EUV mask in accordance with some embodiments described herein. In FIG. 3B, note that the absorber material thickness of SRAFs 322 and 326 is less than the absorber material thickness of main feature 324.

Figure 4A:
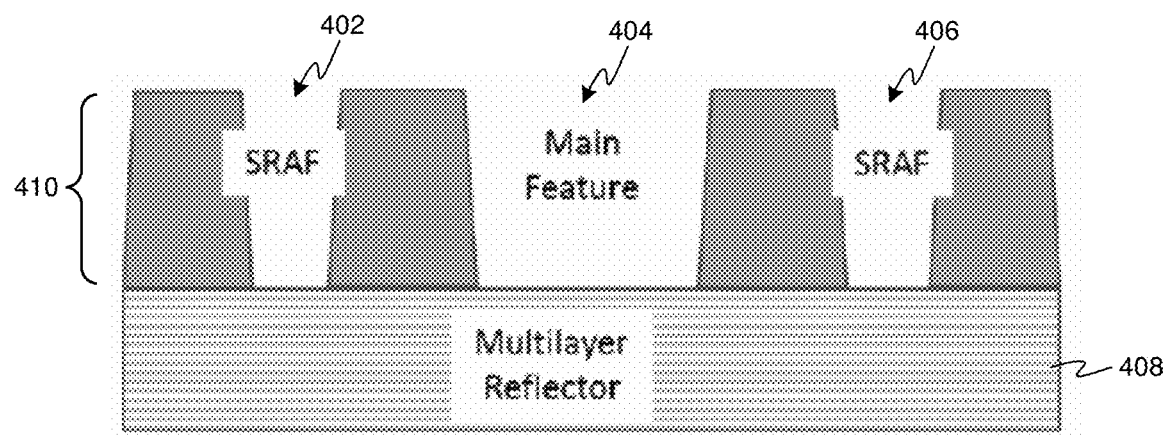
FIGS. 4A-4B illustrate a cross-section of a dark-field EUV mask in accordance with some embodiments described herein.
Figure 4B:
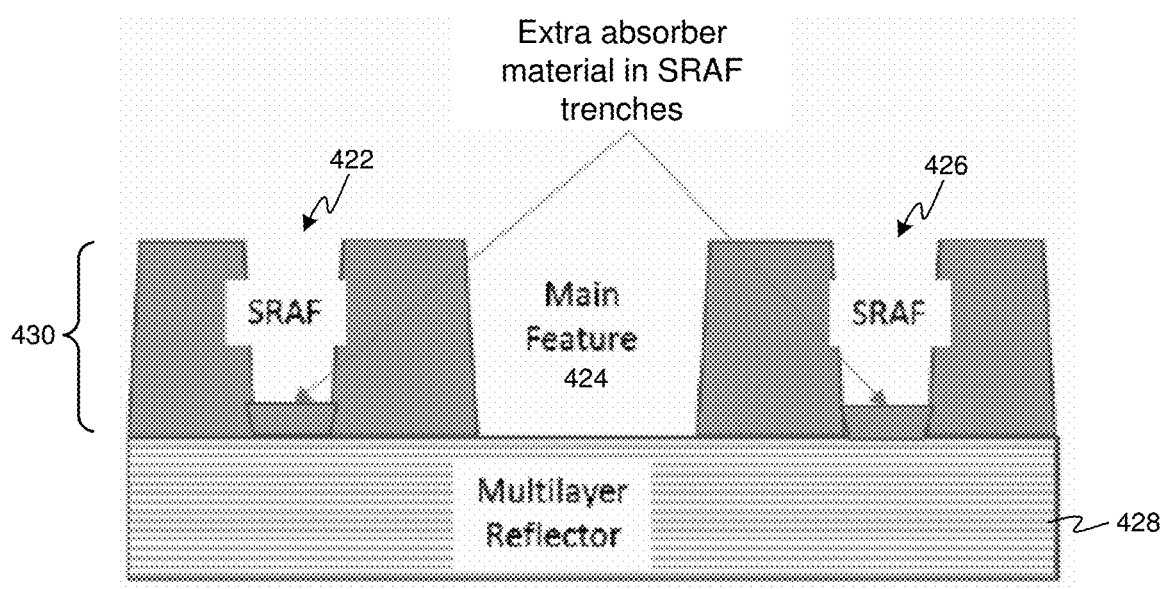

FIGS. 4A-4B illustrate a cross-section of a dark-field EUV mask in accordance with some embodiments described herein. Recall that, in a dark-field EUV mask, the pattern in the resist is formed by removing absorber to allow light through the pattern.

FIG. 4A illustrates main feature trench 404 and SRAF trenches 402 and 406 in absorber material layer 410 that is disposed on multilayer reflector 408 as in a conventional dark-field EUV mask. Note that the main feature trench 404 and SRAF trenches 402 and 406 do not include any absorber material.

FIG. 4B illustrates main feature trench 424 and SRAF trenches 422 and 426 in absorber material layer 430 that is disposed on multilayer reflector 428 in accordance with some embodiments described herein. In FIG. 4B, note that some absorber material is included in SRAF trenches 422 and 426, but main feature trench 424 does not include any absorber material. Specifically, absorber material is added (or left) at the bottom of the SRAF trenches 422 and 426. This extra material blocks some transmitted light preventing imaging in the photoresist.

Figure 5A:
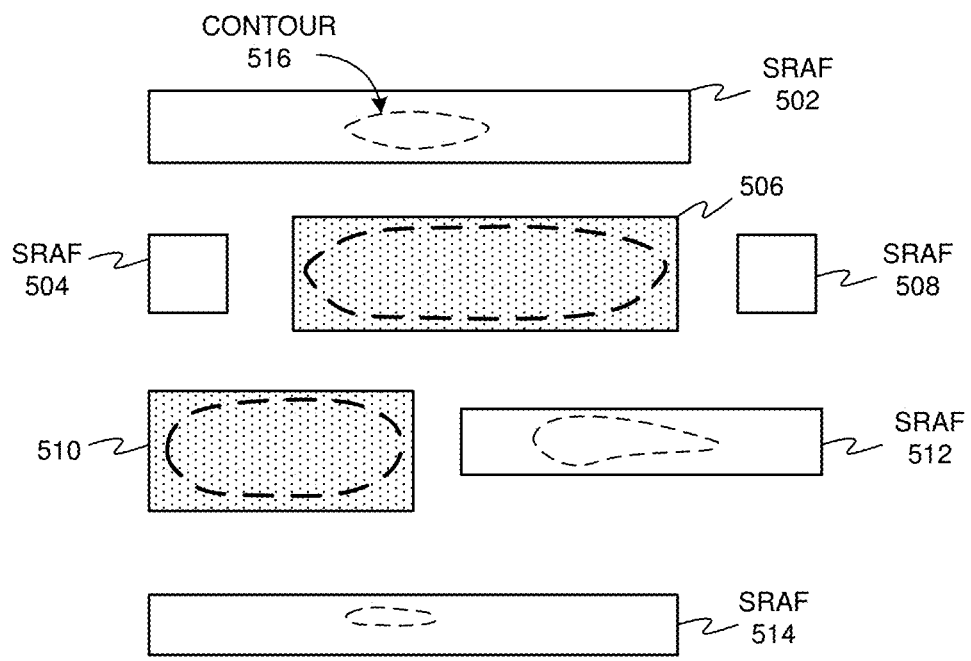
FIGS. 5A-5B illustrates contours of printed features on a wafer in accordance with some embodiments described herein.
Figure 5B:
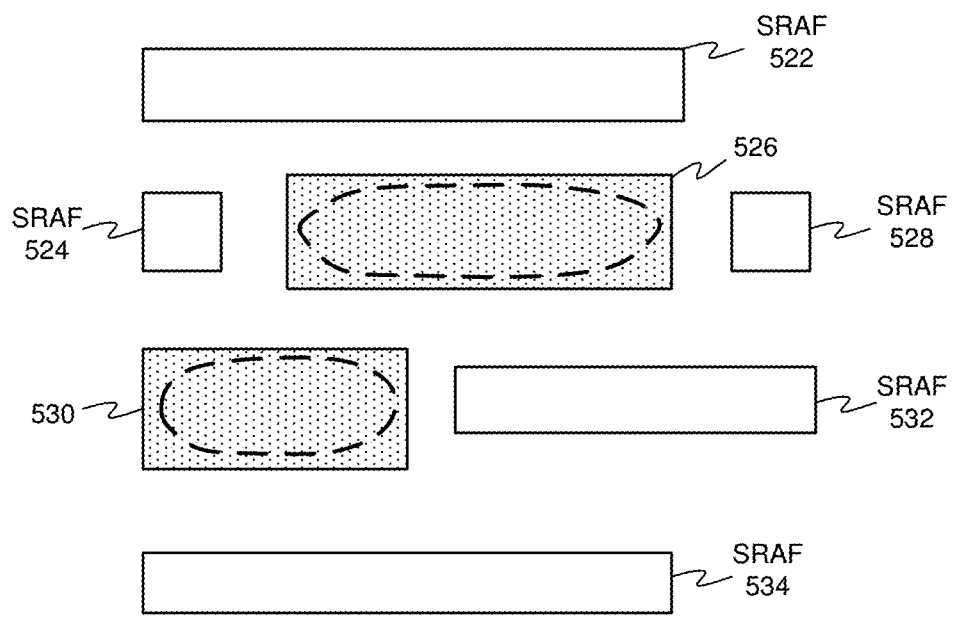

FIGS. 5A-5B illustrates contours of printed features on a wafer in accordance with some embodiments described herein.

FIG. 5A illustrates a top view of a bright-field EUV mask including main features 506 and 510, and SRAFs 502, 504, 508, 512, and 514. In FIG. 5A, the main features and the SRAFs have the same absorber material thickness as in a conventional bright-field EUV mask (e.g., as shown in FIG. 3A). For example, both the SRAF and main feature absorber thickness can be equal to a standard thickness of 60 nm. The contours of the features that are printed on the wafer are illustrated using dashed lines (the contours can be determined by actually printing the features using EUV lithography or by simulating the shapes that are expected to appear on the wafer by using a simulation model for an EUV lithography process). For example, contour 516 illustrates the shape of the feature that is printed on the wafer because of SRAF 502. Note that SRAF 502 was not supposed to print. Likewise SRAFs 512 and 514 were also not supposed to print.

FIG. 5B illustrates a top view of a bright-field EUV mask including main features 526 and 530, and SRAFs 522, 524, 528, 532, and 534. In FIG. 5B, the main features and the SRAFs can have different absorber material thicknesses in accordance with some embodiments described herein (e.g., as shown in FIG. 3B). For example, the main feature absorber thickness can be 60 nm, but the SRAF absorber thickness can be 48 nm. The contours of the features that are printed on the wafer are illustrated using dashed lines (the contours can be determined by actually printing the features using EUV lithography or by simulating the shapes that are expected to appear on the wafer by using a simulation model for an EUV lithography process). For example, the dashed closed curves shown within main features 526 and 530 illustrates the contours of the features that are printed on the wafer. Note that none of the SRAFs have printed.

An additional advantage of embodiments described herein is that thinned SRAFs improve contrast as measured by Image Log Slope (ILS). Specifically, as SRAF thickness is decreased from 15 nm to 5 nm, the ILS improves. This is a positive effect as it increases image contrast helping image formation which, in turn, corresponds to making the sidewalls of the printed features on the wafer to be closer to vertical.

Some embodiments allow different sized SRAFs with different amounts of absorber variation. Specifically, in the bright-field case the absorber thickness can be varied, and in the dark-field case the amount of absorber that is added or left in the trench can be varied. In some embodiments, different SRAFs on the same reticle can have different widths and/or different thickness/absorber additions. In some embodiments, the same SRAF on a single pattern can have variations in its SRAF width and/or absorber thickness.

Figure 6A:
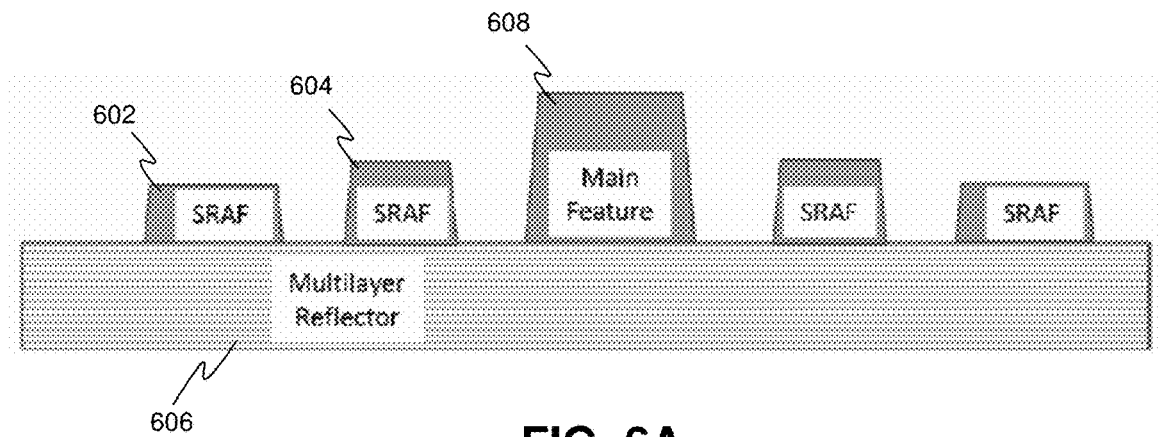
FIGS. 6A-6B illustrate cross-sections of EUV masks in accordance with some embodiments described herein.
Figure 6B:
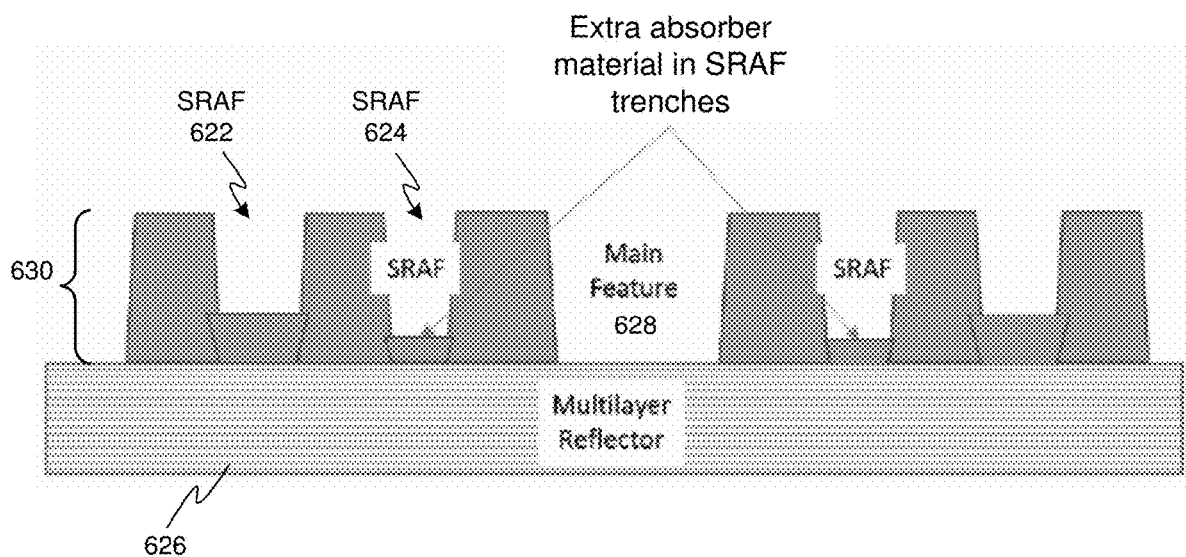

FIGS. 6A-6B illustrate cross-sections of EUV masks in accordance with some embodiments described herein.

In FIG. 6A, main feature 608 and SRAFs 602 and 604 are disposed over multilayer reflector 606. Note that SRAF 602 is less thick than SRAF 604, but SRAF 602 is wider than SRAF 604. Also, note that the thickness of SRAFs 602 and 604 is less than the thickness of main feature 608. Specifically, some embodiments provide a bright-field EUV mask comprising: a multilayer reflector; a set of main features disposed on the multilayer reflector, each main feature made of absorber material having a main feature thickness; and a first SRAF disposed on the multilayer reflector, the first SRAF made of absorber material having a first SRAF thickness that is less than the main feature thickness. In some embodiments, bright-field EUV mask comprises a second SRAF disposed on the multilayer reflector, the second SRAF made of absorber material having a second SRAF thickness that is less than the main feature thickness, but that is different from the first SRAF thickness. In some embodiments, the first SRAF and the second SRAF can have different widths. The bright-field EUV mask can be used to print the set of main features, but not the first SRAF, on a wafer during EUV lithography.

In FIG. 6B, main feature trench 628 and SRAF trenches 622 and 624 are created in absorber material layer 630 that is disposed on multilayer reflector 626. Note that SRAF trench 622 has more absorber material than SRAF trench 624. In other words, the height of the absorber material in SRAF trench 622 is greater than the height of the absorber material in SRAF trench 622. Additionally, note that main feature trench 628 does not include any absorber material. Finally, note that SRAF trench 622 has a greater width than SRAF trench 624. Specifically, some embodiments provide a dark-field EUV mask, comprising: a multilayer reflector; an absorber material layer disposed on the multilayer reflector; a set of main feature trenches in the absorber material layer, each main feature trench not having any absorber material; and a first SRAF trench in the absorber material layer, wherein the SRAF trench includes a first amount of absorber material. In some embodiments, dark-field EUV mask comprises a second SRAF trench in the absorber material layer, wherein the second SRAF trench includes a second amount of absorber material, the second amount being different from the first amount. The dark-field EUV mask can be used to print the set of main feature trenches, but not the first SRAF trench, on a wafer during EUV lithography.

Figure 7A:
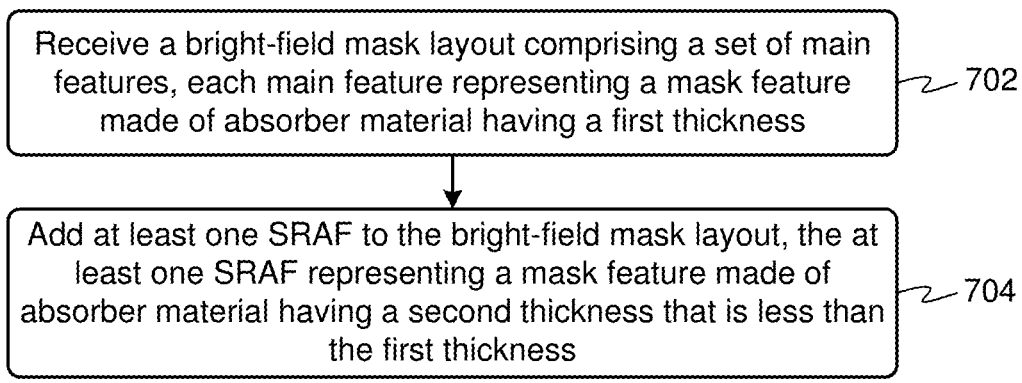
FIG. 7A illustrates a process for modifying a bright-field mask layout to improve wafer contrast in accordance with some embodiments described herein.

FIG. 7A illustrates a process for modifying a bright-field mask layout to improve wafer contrast in accordance with some embodiments described herein.

The process can begin by receiving the bright-field mask layout comprising a set of main feature shapes, each main feature shape representing a mask feature made of absorber material having a first thickness (operation 702). Next, the process can add at least one sub-resolution assist feature (SRAF) shape to the bright-field mask layout, the at least one SRAF shape representing a mask feature made of absorber material having a second thickness that is less than the first thickness (operation 704). The bright-field mask layout can be used to create a bright-field mask for use in EUV lithography. In particular, the bright-field mask can print the set of main feature shapes, but not the at least one SRAF shape, on a wafer during EUV lithography. In some embodiments, the process can add at least two SRAF shapes to the bright-field mask layout, the two SRAF shapes representing mask features made of absorber material having different thicknesses that are less than the first thickness. In some embodiments, the two SRAF shapes can also have different widths (which corresponds to different feature widths). In some embodiments, the process can comprise storing the bright-field mask layout in a data format that allows a distinct absorber material thickness to be specified for each shape in the bright-field mask layout. Some embodiments vary the thickness and the width of the SRAF shape to maximize the impact of the SRAF shape (e.g., maximize the improvement in contrast of main feature shapes if the SRAF shape is being used for that purpose) without causing the SRAF shape to print. In general, the thinner the SRAF shape, the wider the SRAF shape can be without printing.

Figure 7B:
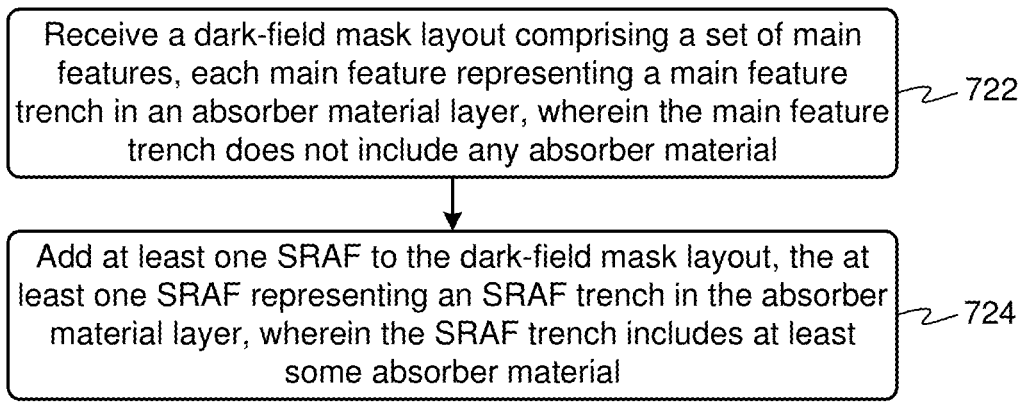
FIG. 7B illustrates a process for modifying a dark-field mask layout to improve wafer contrast in accordance with some embodiments described herein.

FIG. 7B illustrates a process for modifying a dark-field mask layout to improve wafer contrast in accordance with some embodiments described herein.

The process can begin by receiving the dark-field mask layout comprising a set of main feature shapes, each main feature shape representing a main feature trench in an absorber material layer, wherein the main feature trench does not include any absorber material (operation 722). Next, the process can add at least one sub-resolution assist feature (SRAF) shape to the dark-field mask layout, the at least one SRAF shape representing an SRAF trench in the absorber material layer, wherein the SRAF trench includes at least some absorber material (operation 724). The dark-field mask layout can be used to create a dark-field mask for use in EUV lithography. In particular, the dark-field mask can print the set of main feature shapes, but not the at least one SRAF shape, on a wafer during EUV lithography. In some embodiments, the process comprises adding at least two SRAF shapes to the dark-field mask layout, the two SRAF shapes representing SRAF trenches in the absorber material layer having different amounts of absorber material. In some embodiments, the two SRAF shapes can also have different widths (which corresponds to different trench widths). In some embodiments, the process comprises storing the dark-field mask layout in a data format that allows a distinct amount of absorber material to be specified for each SRAF shape in the dark-field mask layout. Some embodiments vary the height or amount of absorber material of the SRAF shape and the width of the SRAF shape to maximize the impact of the SRAF shape (e.g., maximize the improvement in contrast of main feature shapes if the SRAF shape is being used for that purpose) without causing the SRAF shape to print. In general, the lesser the amount of absorber material associated with the SRAF shape, the wider the SRAF shape can be without printing.

Embodiments disclosed in reference to FIGS. 7A-7B can be implemented in a proximity correction application (e.g., an optical proximity correction (OPC) application) that modifies a mask layout (by adding, deleting and/or editing printing and non-printing shapes) to improve manufacturability.

Typically, such applications use a mathematical model (e.g., an EUV lithography process model) to simulate the effect of shape modifications, and to manipulate the geometries of input design polygons to improve pattern fidelity on a printed wafer. EUV lithography systems typically distort the mask pattern's image on the wafer due to diffraction effects. The printed image distortions, called proximity effects, can cause critical dimension (CD) control problems for IC layouts. Therefore, it is necessary to adjust the original mask layout design to counter the proximity effects.

The goal of proximity correction is to compensate optical, photoresist, and other known effects by making appropriate modifications to the EUV mask. The EUV mask manipulation problem can be formulated as follows: for a given final desired pattern on the wafer, find an input mask design which will generate the desired pattern after all the EUV lithographic steps and photoresist processing has been performed.

As mentioned above, model-based proximity correction employs mathematical models to represent the image formation process of the EUV lithography system. Model-based proximity correction techniques are typically iterative and are well-known in the art. Specifically, some embodiments described herein can iteratively try different SRAF shape configurations until an optimal SRAF shape configuration is converged upon.

Figure 8:
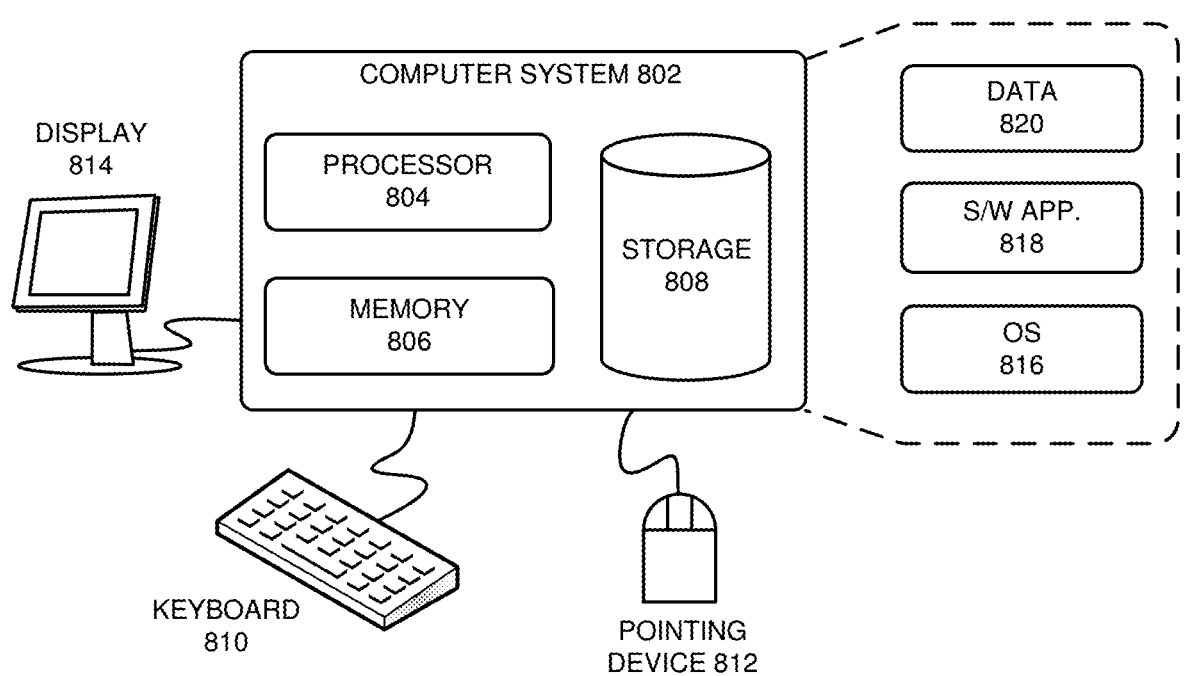
FIG. 8 illustrates a computer system in accordance with some embodiments described herein.

FIG. 8 illustrates a computer system in accordance with some embodiments described herein. The term "computer" or "computer system" generally refers to a hardware-based system that can perform computations required for the design and manufacture of ICs. Computer system 802 can include processor 804, memory 806, and storage device 808. Computer system 802 may include multiple processors, and processor 804 may include multiple cores. Specifically, memory locations in memory 806 can be addressable by processor 804, thereby enabling processor 804 to access (e.g., via load/store instructions) and manipulate (e.g., via logical/floating point/arithmetic instructions) the data stored in memory 806. Computer system 802 can be coupled to display device 814, keyboard 810, and pointing device 812. Storage device 808 can store operating system 816, software application 818, and data 820. Data 820 can include input required by software application 818 and/or output generated by software application 818.

Computer system 802 may automatically (or with user help) perform one or more operations that are implicitly or explicitly described in this disclosure. Specifically, computer system 802 can load software application 818 into memory 806, and software application 818 can then be used to add SRAF shapes to EUV mask layouts by using the above-mentioned processes. The resulting EUV masks are more manufacturable because of improved wafer contrast.

While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32 F.3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. Many forms of knowledge, learning, skills and styles are authored, structured, and enabled—objectively—as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about at the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more ('ensemble') electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a wire with one end attached to the component and the other end attached to another component, typically as part of a circuit with current flows. There are at least three types of electrical components: passive, active and electromechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures—such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information that typically is limited in size and/or complexity. For example, the term 'module' can signify one or more processes that transforms data and information, for example, processes comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules (e.g., a central processing unit, 'CPU'; an input/output (I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('APP) that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network. This process is discussed in the General Computer Explanation section.

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} used in commerce—or improves upon an existing commercial solution {see Diehr})—is precisely defined by the inventor(s) {see MPEP 2111.01 (9th edition, Rev. 08.2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract' } how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art publications that can be combined {see Alice} by a skilled person {often referred to as a 'PHOSITA', see MPEP 2141-2144 (9th edition, Rev. 08.2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof, solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person. Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the Claims.

The foregoing embodiments have been presented for purposes of illustration and description. They are not intended to be exhaustive or to limit the scope of this disclosure to the forms disclosed. Accordingly, many modifications and variations will be apparent to practitioners skilled in the art. Additionally, the above disclosure is not intended to limit the disclosed subject matter. The scope of the claimed invention(s) is defined by the appended claims.

What is claimed is:

1. A non-transitory computer-readable storage medium storing instructions, which when executed by a processor, cause the processor to:
   receive a bright-field mask layout comprising a set of main feature shapes, each main feature shape representing a mask feature made of absorber material having a first thickness;
   add at least one sub-resolution assist feature (SRAF) shape to the bright-field mask layout, the at least one SRAF shape representing a mask feature made of absorber material having a width and a second thickness; and
   use an extreme ultraviolet (EUV) lithography process model to vary the width and the second thickness of the SRAF.

2. The non-transitory computer-readable storage medium of claim 1, wherein the bright-field mask layout is used to create a bright-field mask for use in EUV lithography.

3. The non-transitory computer-readable storage medium of claim 2, wherein the bright-field mask prints the set of main feature shapes, but not the at least one SRAF shape, on a wafer during EUV lithography.

4. The non-transitory computer-readable storage medium of claim 1, wherein the method comprises adding at least two SRAF shapes to the bright-field mask layout, the two SRAF shapes representing mask features made of absorber material having different thicknesses that are less than the first thickness.

5. The non-transitory computer-readable storage medium of claim 1, wherein the method comprises storing the bright-field mask layout in a data format that allows a distinct absorber material thickness to be specified for each shape in the bright-field mask layout.

6. A non-transitory computer-readable storage medium storing instructions, which when executed by a processor, cause the processor to:
   receive a dark-field mask layout comprising a set of main feature shapes, each main feature shape representing a main feature trench in an absorber material layer, wherein the main feature trench does not include any absorber material;
   add at least one sub-resolution assist feature (SRAF) shape to the dark-field mask layout, the at least one SRAF shape representing an SRAF trench in the absorber material layer, wherein the SRAF trench has a width and includes an amount of absorber material; and
   use an extreme ultraviolet (EUV) lithography process model to vary the width and the amount of absorber material in the SRAF trench.

7. The non-transitory computer-readable storage medium of claim 6, wherein the dark-field mask layout is used to create a dark-field mask for use in EUV lithography.

8. The non-transitory computer-readable storage medium of claim 7, wherein the dark-field mask prints the set of main feature shapes, but not the at least one SRAF shape, on a wafer during EUV lithography.

9. The non-transitory computer-readable storage medium of claim 6, wherein the method comprises adding at least two SRAF shapes to the dark-field mask layout, the two SRAF shapes representing SRAF trenches in the absorber material layer having different amounts of absorber material.

10. The non-transitory computer-readable storage medium of claim 6, wherein the method comprises storing the dark-field mask layout in a data format that allows a distinct amount of absorber material to be specified for each SRAF shape in the dark-field mask layout.

11. A method, comprising:
   receiving a bright-field mask layout comprising a set of main feature shapes, each main feature shape representing a mask feature made of absorber material having a first thickness;
   adding at least one sub-resolution assist feature (SRAF) shape to the bright-field mask layout, the at least one SRAF shape representing a mask feature made of absorber material having a width and a second thickness; and
   performing, by a processors, optical proximity correction (OPC) on the bright-field mask layout, wherein the performing OPC uses an extreme ultraviolet (EUV) lithography process model to vary the width and the second thickness of the SRAF.

12. The method of claim 11, wherein the bright-field mask layout is used to create a bright-field mask for use in EUV lithography.

13. The method of claim 12, wherein the bright-field mask prints the set of main feature shapes, but not the at least one SRAF shape, on a wafer during EUV lithography.

14. The method of claim 11, wherein the method comprises adding at least two SRAF shapes to the bright-field mask layout, the two SRAF shapes representing mask features made of absorber material having different thicknesses that are less than the first thickness.

15. The method of claim 11, wherein the method comprises storing the bright-field mask layout in a data format that allows a distinct absorber material thickness to be specified for each shape in the bright-field mask layout.

* * * * *